United States Patent
Hozoi et al.

(10) Patent No.: US 9,645,174 B2
(45) Date of Patent: May 9, 2017

(54) RESISTIVE VOLTAGE DIVIDER WITH IMPROVED PHASE ACCURACY

(71) Applicant: ABB AG, Mannheim (DE)

(72) Inventors: Adrian Hozoi, Mannheim (DE); Rolf Disselnkötter, Mauer (DE)

(73) Assignee: ABB AG, Mannheim (DE)

( * ) Notice: Subject to any disclaimer, the term of this patent is extended or adjusted under 35 U.S.C. 154(b) by 395 days.

(21) Appl. No.: 14/010,080

(22) Filed: Aug. 26, 2013

(65) Prior Publication Data

US 2013/0342187 A1 Dec. 26, 2013

Related U.S. Application Data

(63) Continuation of application No. PCT/EP2012/000780, filed on Feb. 23, 2012.

(30) Foreign Application Priority Data

Feb. 25, 2011 (EP) ..................................... 11001579

(51) Int. Cl.
*G01R 15/06* (2006.01)
*H01J 13/46* (2006.01)
(Continued)

(52) U.S. Cl.
CPC ............... *G01R 15/04* (2013.01); *H01C 1/16* (2013.01); *H01C 10/16* (2013.01); *H01C 13/02* (2013.01)

(58) Field of Classification Search
CPC ...... G01R 27/02; G01R 33/09; G01R 33/093; H01C 17/006; H01C 7/006; H01C 1/148;
(Continued)

(56) References Cited

U.S. PATENT DOCUMENTS 5,521,576 A 5/1996 Collins
5,929,746 A * 7/1999 Edwards, Jr. ............ H01C 1/14
338/203
(Continued)

FOREIGN PATENT DOCUMENTS

CH DE 19841164 A1 * 3/2000 ............. G01R 15/06
CN 101577161 A 11/2009
(Continued)

OTHER PUBLICATIONS

Eichhorn Walter,Mar. 2000, CH, A1.*
(Continued)

*Primary Examiner* — Patrick Assouad
*Assistant Examiner* — Taqi Nasir
(74) *Attorney, Agent, or Firm* — Taft Stettinius & Hollister LLP (57) ABSTRACT

A resistive voltage divider includes a first resistor and a second resistor electrically connected in series. Each of the resistors is made of an electrically resistive film material and applied in the form of a trace onto an insulating substrate. The divider's voltage ratio has a value between one hundred and one million, where two ends of the trace of the second resistor overlap at least in part with a first and a second) contacting terminal, respectively, and two ends of the trace of the first resistor overlap at least in part with the first and third contacting terminal, respectively. In order to decrease the parasitic capacitance between the first contacting terminal and the third contacting terminal, the second contacting terminal is placed with at least a screening part between the first and the third contacting terminals.

24 Claims, 7 Drawing Sheets

(51) Int. Cl.
*G01R 15/04* (2006.01)
*H01C 1/16* (2006.01)
*H01C 13/02* (2006.01)
*H01C 10/16* (2006.01)

(58) Field of Classification Search
CPC .......... H01C 1/142; H01C 1/14; H01C 1/028; H01C 7/06
USPC .......... 324/691, 421, 207.21, 525, 549, 727, 324/416, 522; 338/314, 307–309, 226, 338/48, 195, 239
See application file for complete search history.

(56) References Cited

U.S. PATENT DOCUMENTS

| | | | |
|---|---|---|---|
| 6,111,494 A | 8/2000 | Fischer et al. | |
| 6,258,283 B1 | 7/2001 | Mikami et al. | |
| 6,593,697 B1 * | 7/2003 | Aarnink | H01J 29/96 315/3 |
| 7,079,004 B2 * | 7/2006 | Budak | G01R 15/06 338/195 |
| 8,581,657 B2 * | 11/2013 | Itoh | G05F 1/56 327/525 |
| 2005/0205549 A1 * | 9/2005 | Crawford | G05D 23/20 219/494 |
| 2013/0335106 A1 | 12/2013 | Hozoi et al. | |
| 2013/0342227 A1 | 12/2013 | Hozoi et al. | |
| 2013/0346004 A1 | 12/2013 | Hozoi et al. | |
| 2014/0043014 A1 | 2/2014 | Ho et al. | |

FOREIGN PATENT DOCUMENTS

| | | | | |
|---|---|---|---|---|
| DE | 41 23 249 A1 | 1/1993 | | |
| DE | 195 37 155 A1 | 4/1997 | | |
| DE | 198 41 164 A1 | 3/2000 | | |
| EP | 0 536 895 A1 | 4/1993 | | |
| GB | 735 889 A | 8/1955 | | |
| GB | 735889 | * | 8/1955 | |
| GB | 735889 A | * | 8/1955 | .......... H01C 17/245 |
| GB | 1 539 774 A | 2/1979 | | |
| WO | 01/33602 A1 | 5/2001 | | |

OTHER PUBLICATIONS

George Victor Planer, Aug. 1955, UK.*
International Search Report (PCT/ISA/210) issued on Apr. 27, 2012, by the European Patent Office as the International Searching Authority for International Application No. PCT/EP2012/000780.
Written Opinion (PCT/ISA/237) issued on Apr. 27, 2012, by the European Patent Office as the International Searching Authority for International Application No. PCT/EP2012/000780.
International Search Report (Form PCT/ISA/210) issued on Apr. 26, 2012, by the European Patent Office in the International Application No. PCT/EP2012/000779. (2 pages).
International Search Report (Form PCT/ISA/210) and the Written Opinion of the International Searching Authority (Form PCT/ISA/237) issued on Apr. 27, 2012, by the European Patent Office in the International Application No. PCT/EP2012/000781. (9 pages).
Notification of Transmittal of the International Search Report (Forms PCT/ISA/220 and PCT/ISA/210) and the Written Opinion of the International Searching Authority (Form PCT/ISA/237) issued on Aug. 21, 2012, by the European Patent Office in the International Application No. PCT/EP2012/000818. (10 pages).

* cited by examiner

RESISTIVE VOLTAGE DIVIDER WITH IMPROVED PHASE ACCURACY

RELATED APPLICATION

This application claims priority as a continuation application under 35 U.S.C. §120 to PCT/EP2012/000780, which was filed as an International Application on Feb. 23, 2012 designating the U.S., and which claims priority to European Applicaiton 11001579.9 filed in Europe on Feb. 25, 2011. The entire contents of these applications are hereby incorporated by reference in their entireties.

FIELD

The disclosure relates to a resistive voltage divider which comprises at least a first and a second resistor electrically connected in series.

BACKGROUND INFORMATION

The resistors are made of an electrically resistive film material which is applied in form of a trace onto an insulating substrate. The two ends of the trace of the second resistor overlap at least in part with a first and a second contacting terminal, respectively, and the two ends of the trace of the first resistor overlap at least in part with the second and a third contacting terminal, respectively. Typically, the second contacting terminal is connected to a reference potential such as ground, the third contacting terminal is connected to an input voltage potential, and the first contacting terminal provides, with respect to the reference potential, a voltage which is proportional to the voltage ratio and the input voltage potential. The divider's voltage ratio has a value between one hundred and one million The voltage divider may consist in its simplest form of just two serial resistors, one with a high resistance value and the other with a low resistance value. In more advanced cases, the one or both of the serial resistors can be replaced by resistive networks having respective equivalent resistance values. These resistors or corresponding resistor networks may in the following also be called high and low ohmic resistors, respectively. In the voltage divider, both the high and low ohmic resistors are brought onto the same substrate.

Different techniques are known to manufacture resistors by bringing a noninsulating electrically resistive film or foil material, such as metal film or metal foil, e.g. nickel chromium, cermet film, e.g. tantalum nitride, ruthenium dioxide, bismuth ruthenate, carbon film, or a film of a composite material based on a mixture of glass and cermet onto an insulating substrate. In rare cases, the electrically resistive film material may consist of multiple layers of different of the above named materials. The insulating substrate can be ceramic, silicon, glass or some other synthetic material, and the film material is applied to the substrate by methods such as sputtering (thin film), screen and stencil printing (thick film) or direct printing through a nozzle (thick film). The insulating substrate may have the form of a flat planar sheet or of a cylinder, and accordingly the resistive film is deposited either onto a two-dimensional planar surface or onto a three-dimensional axially symmetric surface. In the voltage divider, both the high and low ohmic resistors are brought onto the same substrate. In addition, highly conductive structures with considerable lower resistivity than the film material of the resistors are deposited on the substrate as well. The highly conductive structures are intended to be used as contacting terminals, and they are placed on the substrate in such a way that the resistive film material of the resistors overlaps at least partly with them.

In order to achieve voltage ratios of significantly more than unity and at the same time to reduce the size of the voltage divider, it is known to arrange the resistive film material of the high ohmic resistor in a long and narrow trace, where the trace is shaped like a meandering form. The term meandering form means that the trace is not just a straight line but curved in such a way that a long length is achieved on a small substrate area. The meandering form may look for example like a square wave, a triangle wave, a sine wave, a serpentine, a zigzag or—in the three-dimensional case—a helical form. This is for example described in U.S. Pat. No. 5,521,576 for thick film resistors and in U.S. Pat. No. 7,079,004 B2 for thin film AC voltage dividers. As is disclosed there as well, the low resistance value of the low ohmic resistor is commonly obtained by arranging the resistive film material in a short and wide trace.

In general, the above described resistive voltage dividers can be used for a wide range of voltage levels, from low over medium up to high voltage applications. While the present disclosure originates from the area of medium voltage sensors, such as the KEVCD and KEVA sensor types by ABB, which are commonly applicable to a voltage range between 3.6 kV and 36 kV, its area of application is not limited to this voltage range.

As is known from the art, for example from U.S. Pat. Nos. 5,521,576 and 7,079,004 B2, the first contacting terminal is commonly placed between the second and the third contacting terminals. The second contacting terminal is connected to a reference potential such as ground, the third contacting terminal is connected to an input voltage potential, and the first contacting terminal provides, with respect to the reference potential, a voltage which is proportional to the voltage ratio and the input voltage potential. As a result, a first parasitic capacitance occurs in parallel with the high ohmic resistor, i.e. between the first and the third contacting terminals, and a second parasitic capacitance occurs in parallel with the low ohmic resistor, i.e. between the first and the second contacting terminals. It is assumed that the high ohmic resistor has a resistance value $R_1$, the low ohmic resistor a resistance value $R_2$, the first parasitic capacitance a value $C_1$ and the second parasitic capacitance a value $C_2$. When an AC voltage is applied to the input of the voltage divider between the second and the third contacting terminals, the AC output voltage between the second and the first contacting terminals shows no phase error in case that the voltage ratio $(R_1+R_2)/R_2$ equals the ratio of the second parasitic capacitance to the first parasitic capacitance $(C_1+C_2)/C_1$. The phase error increases with an increasing mismatch of these ratios.

The inventors have understood that for voltage dividers with a high voltage ratio $(R_1+R_2)/R_2$ above one hundred, the corresponding resistance ratio $(R_1+R_2)/R_2$ is significantly higher than the ratio of the parasitic capacitances $(C_1+C_2)/C_1$, which leads to a high phase error. The phase error can be corrected by adding compensation capacitors in parallel to the low ohmic resistor. However, this adds to the complexity of the voltage divider, which increases the designing and manufacturing effort and thereby the costs. In addition, the compensation of the phase error is usually not achieved over the whole operating temperature range, humidity range and life time of the voltage divider, since the parasitic capacitances and the compensation capacitors have different temperature coefficients, humidity absorption properties and long term drifting. In other words, the phase accuracy can not be sufficiently ensured when using compensation capacitors.

SUMMARY

An exemplary embodiment of the present disclosure provides a resistive voltage divider which includes: a first resistor and a second resistor electrically connected in series, wherein each of the resistors made of an electrically resistive film material and applied in the form of a trace onto an insulating substrate. A voltage ratio of the resistive voltage divider has a value between one hundred and one million. Two ends of a trace of the second resistor overlap at least in part with a first contacting terminal and a second contacting terminal, respectively. Two ends of a trace of the first resistor overlap in part with first and third -contacting terminals, respectively. The second contacting terminal is placed with at least a screening part between the first and the third contacting terminals.

BRIEF DESCRIPTION OF THE DRAWINGS

The disclosure and its advantages will become more apparent from the appended drawings and from the corresponding description.

DETAILED DESCRIPTION

Exemplary embodiments of the present disclosure provide a voltage divider with a high voltage ratio and improved phase accuracy.

These features are achieved by placing the second contacting terminal with at least one part, which in the following is called a screening part, between the first and the third contacting terminals. By placing at least a part of the second contacting terminal between the first terminal and the third terminal, the first terminal becomes at least in part electrically screened from the third terminal. As a result, the first parasitic capacitance between the first terminal and the third terminal is decreased making it easier to match the resistance ratio $(R_1+R_2)/R_2$ with the ratio of the parasitic capacitances $(C_1+C_2)/C_1$ without the need for extra compensation capacitors. Accordingly, the phase accuracy is improved.

Figure 1:
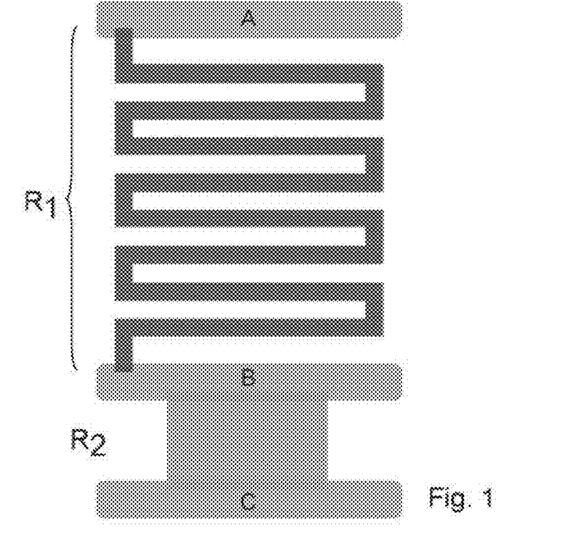
FIG. 1 shows a resistive voltage divider known from the art with high and low ohmic resistors.

The voltage divider of FIG. 1 is known from the art, where the high ohmic resistor with a resistance value $R_1$ has a long and narrow trace with multiple bends and where the low ohmic resistor with a resistance value $R_2$ has a short and wide trace. The high ohmic resistor is placed between a third contacting terminal A and a first contacting terminal B and the low ohmic resistor between the first contacting terminal B and a second contacting terminal C. The resistive film material used for the high and low ohmic resistors differs here.

Figure 2:
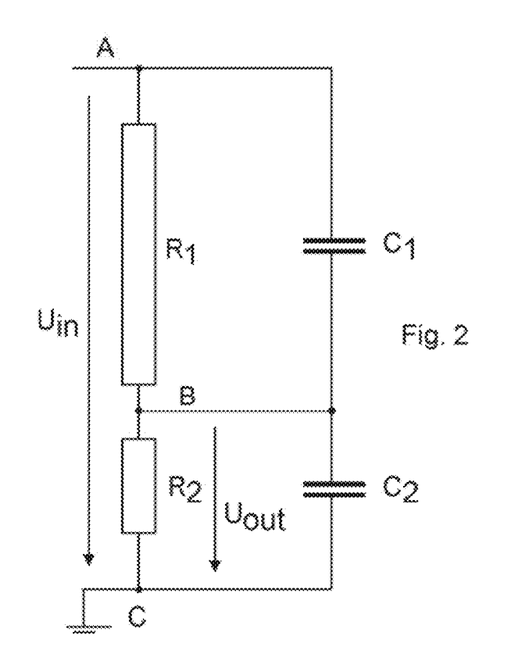
FIG. 2 shows a schematic electrical diagram of the use of a resistive voltage divider for measurement purposes.

An equivalent schematic electrical diagram of the voltage divider of FIG. 1 is shown in FIG. 2. Such a voltage divider is for example used in voltage sensors for the medium voltage range between 3.6 kV and 36 kV, such as the KEVCD and KEVA sensor types by ABB. In voltage sensors, an input voltage $U_{in}$, which represents the quantity to be measured, is applied between the third and second contacting terminals A and C, and an output voltage $U_{out}$, having a much smaller value reduced by a factor equal to the voltage divider's ratio $(R_1+R_2)/R_2$, is then delivered to an electronic circuitry in order to be processed and transformed into a measurement value. The second contacting terminal C is connected to ground in this particular example. Due to the dielectric properties of the surrounding environment and of the substrate of the resistive divider, a first parasitic capacitance $C_1$ occurs in parallel with the high ohmic resistor, i.e. between the third and the first contacting terminals A and B, and a second parasitic capacitance $C_2$ occurs in parallel with the low ohmic resistor, i.e. between the first and the second contacting terminals B and C.

Figure 3:
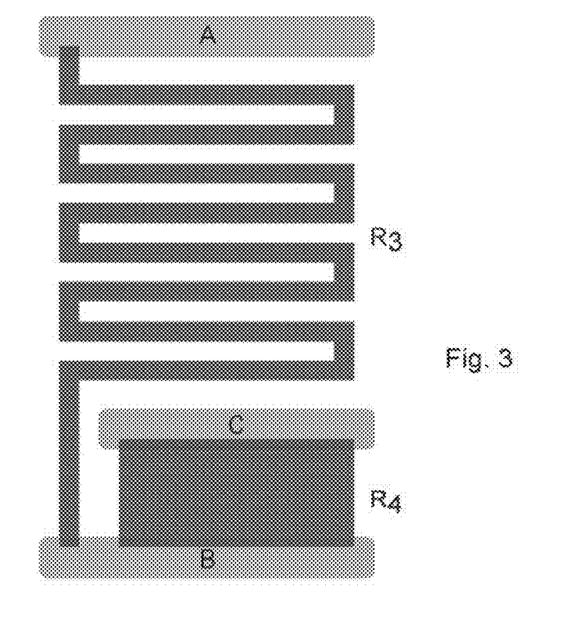
FIGS. 3 to 11 show different embodiments of a resistive voltage divider according to the disclosure.

A first embodiment of the disclosure is schematically shown in FIG. 3. In order to reduce the first parasitic capacitance $C_1$ and thereby increase the ratio of the parasitic capacitances $(C_1+C_2)/C_1$ so that the matching with the resistance ratio $(R_1+R_2)/R_2$ becomes easier, the second contacting terminal C is completely placed in between the third and the first contacting terminals A and B. Accordingly, the screening part of the second contacting terminal C is the terminal itself. In this embodiment, all three contacting terminals have a rectangular shape with rounded corners and are placed geometrically in parallel with each other. The second contacting terminal C functions as a shield for the first contacting terminal B with respect to the third contacting terminal A. The high ohmic resistor has a resistance value $R_3$ due to its slightly longer trace compared to FIG. 1, and the low ohmic resistor has resistance value $R_4$.

Figure 4:
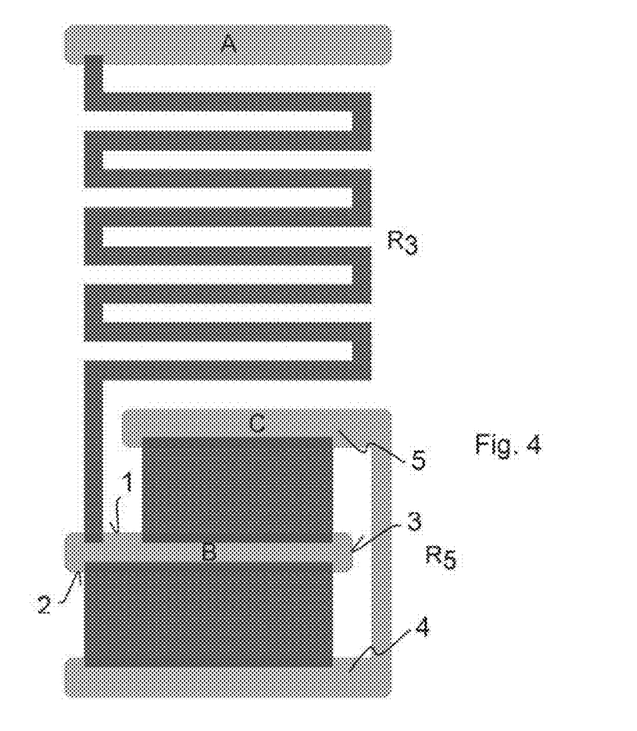

In the second embodiment according to FIG. 4, the second contacting terminal C has a U-shaped form and surrounds the first contacting terminal B almost completely from three sides, thereby not only improving the screening effect with respect to the third contacting terminal A but also introducing a shielding with respect to the environment. The first contacting terminal B has an elongated rectangular shape with rounded corners and a first longitudinal side 1 and an opposing second longitudinal side 2. The first longitudinal side 1 includes with the third contacting terminal A an angle of zero degrees, i.e. it is placed geometrically in parallel with the third contacting terminal A. The screening part 5 of the second contacting terminal C is placed in parallel with the first contacting terminal B, as well, in between the first and the third contacting terminals B and A, and it covers the length of the first longitudinal side 1 substantially. In addition to the screening effect, the second contacting terminal C shields completely the second longitudinal side 2, which faces away from the second and third contacting terminals A and C, and the side 3 to the right, which faces away from the area where the trace of the high ohmic resistor overlaps with the first contacting terminal B. The second contacting terminal C is connected to a reference potential, preferably ground, and the third contacting terminal A is connected to an input voltage potential.

In the second embodiment as well as in further embodiments described below, the low ohmic resistor is made up of more than just one single resistor trace. The advantages are explained in the following.

Increased voltage ratios of up to one megavolt are usually required for medium and high voltage applications. Such voltage ratios may be achieved by increasing the length of the high ohmic resistor. However, there are limits with respect to the available substrate area and the acceptable size of the voltage divider. Another possibility is to use significantly different resistive film materials for the high and low ohmic resistors. However, this results in additional process steps and errors during the manufacturing and accordingly in increased costs and reduced accuracy. The inventors have realized that the use of different resistive film materials in addition deteriorates the initial accuracy, the temperature stability and the long term stability of the voltage ratio. This is due to the fact that with different materials it is more difficult to achieve good initial accuracy of the voltage ratio, so that post-processing operations, such as laser trimming of one or of both the high and low ohmic resistors, are required to adjust the accuracy. Furthermore, it can no longer be ensured that the drifting of the operating characteristics of both the high and the low ohmic resistors occur in the same direction and with possibly the same amount so that the ratio of the resistance values and thereby the divider's voltage ratio can no longer be maintained at its initial value over changing temperature or over a long period of time.

To overcome these drawbacks, it is therefore suggested with the second and further embodiments to always use the same resistive film material for all the resistors in the divider, which in case of composite materials means for example to use not only the same kind of composite but the same composite with exactly the same resistivity. As a result, the initial accuracy, the temperature and the long term stability of the voltage ratio are increased, and the manufacturing of the high and low ohmic resistors may occur within one and the same series of process steps, which not only is more cost effective but also leads to the same trace thickness for the high and the low ohmic resistors, thereby increasing the accuracy even further.

The desired high voltage ratio is achieved by replacing the commonly known short and wide trace of the low ohmic resistor by a network of multiple resistors which are electrically connected in parallel.

In the embodiment of FIG. 4, the resistance value $R_5$ of the low ohmic resistor is achieved by a network of two parallel resistors. A wide and straight trace line overlaps with the first longitudinal side 1 of the first contacting terminal B and extends towards the screening part 5 of the second contacting terminal C and partly overlaps with it, thereby forming a so called second resistor. Another wide and straight trace line overlaps with the second longitudinal side 2 of the first contacting terminal B and extends towards the left boundary 4 of the U-shape of the second contacting terminal C and partly overlaps with it, thereby forming a so called third resistor. By this arrangement, the second and third resistors are electrically connected in parallel. The resulting resistance value of this parallel connection is the resistance value $R_5$ of the low ohmic resistor. The high ohmic resistor, also called first resistor, is unchanged with respect to FIG. 3, i.e. it has again the resistance value $R_3$. Accordingly, the voltage ratio of the divider is $(R_3+R_5)/R_5$. The resistance value $R_5$ is decreased compared to $R_4$ of FIG. 3, due to the parallel connection of two resistor traces with approximately the same length and width as the one resistor trace of FIG. 3, thereby increasing the voltage ratio.

Figure 5:
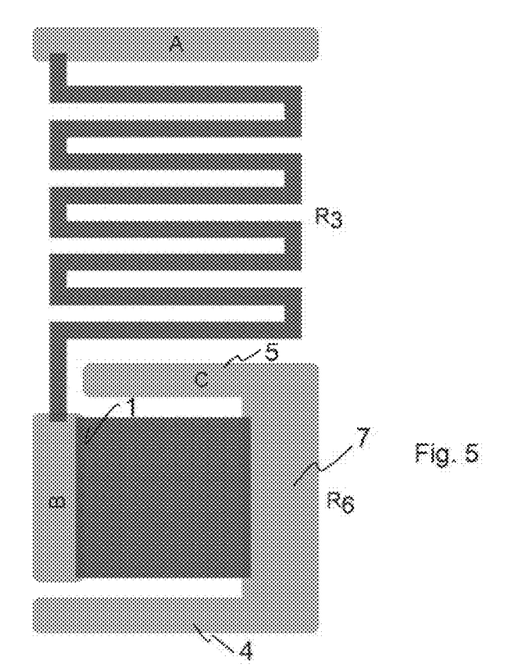

A third embodiment, as shown in FIG. 5 differs from the first and second embodiments in that the first contacting terminal B is rotated with respect to the third and the second contacting terminals A and C. The first and third contacting terminals B and A have again elongated rectangular shapes. The second contacting terminal C is again in a U-shaped form. The first longitudinal side 1 of the first contacting terminal B includes with the third contacting terminal A an angle of ninety degrees. The screening part of the second contacting terminal C stretches across the whole ninety degrees, i.e. in this embodiment the screening part consists of the part 5, which is the right boundary of the U-shape, and of the bottom 7 of the U-shape. The left boundary 4 functions again as a shield against environmental disturbances. The low ohmic resistor with the resistance value $R_6$ is made up by one second resistor only, where the trace of the second resistor overlaps with the first longitudinal side 6 and partly with the bottom 7 of the U-shape of the second contacting terminal C.

Figure 6:
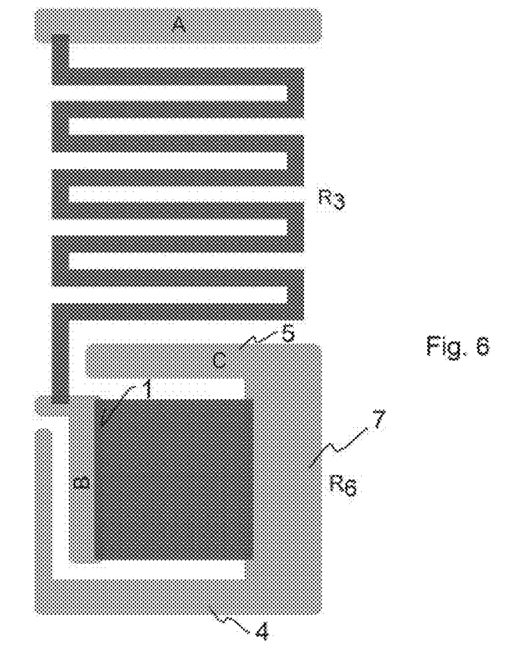

A fourth embodiment which is a further development of the third embodiment is shown in of FIG. 6. It extends beyond the third embodiment in that the second contacting terminal C surrounds the first contacting terminal B almost completely from four sides.

Figure 7:
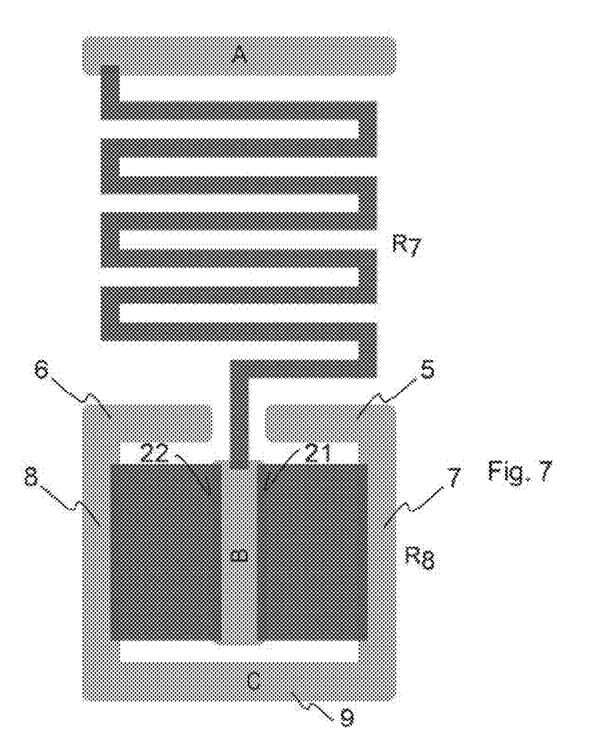

FIG. 7 shows a fifth embodiment, where the second contacting terminal B with its elongated shape is placed in such a way that both the first and the second longitudinal sides 21 and 22 each include with the third contacting terminal A an angle of ninety degrees. The screening part of the second contacting terminal C stretches across both angles by having the form of two U-shapes being oriented with the openings of the U's towards each other and surrounding the second contacting terminal B. Accordingly, the screening part consists of the already described right boundary 5 and the bottom 7 of one of the U-shapes and of the left boundary 6 and the bottom 8 of the other U-shape. In this embodiment, the resistance value $R_8$ of the low ohmic resistor is again achieved by a second and a third resistor electrically connected in parallel. The resistance value $R_7$ of the high ohmic resistor differs slightly from the previous embodiments due to a change in the length of the trace.

In order to increase the voltage ratio of the voltage divider even further, any number of resistors can be connected in parallel with the network of the low ohmic resistor. Thereby, it is desirable to maintain a compact size. This is achieved according to another embodiment of the disclosure, which suggests shaping the two contacting terminals B and C of the low ohmic resistor both in a comb-shaped form, arranging their teeth in an interdigitated manner without touching each other and placing the multiple resistors between and overlapping with the teeth.

Figure 8:
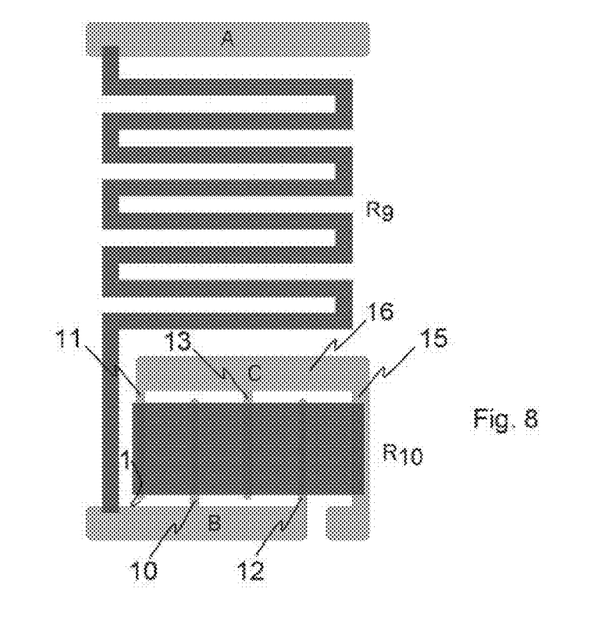
Figure 9:
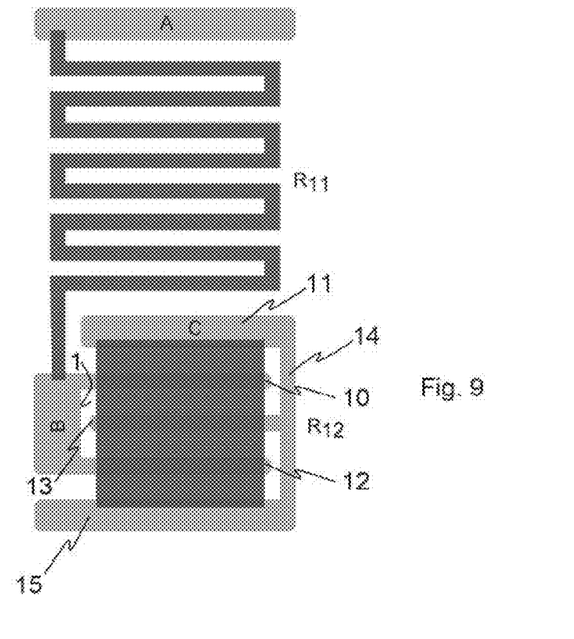
Figure 14:
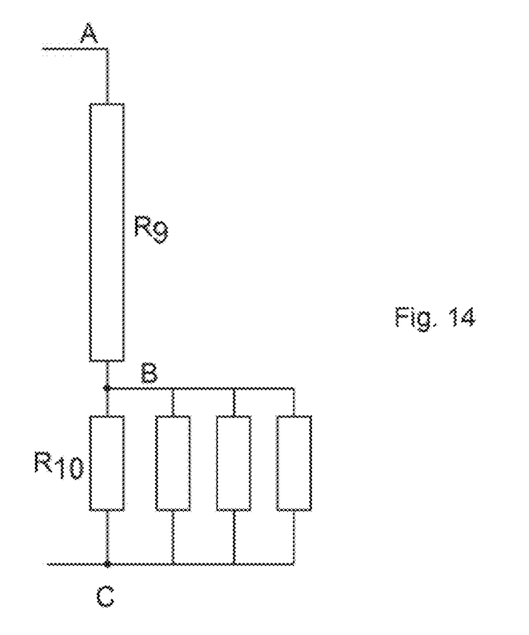
FIG. 14 shows a schematic electrical diagram of the embodiment of FIG. 8.

Two examples of this embodiment are shown in FIGS. 8 and 9. In FIG. 8, it can be seen that the first contacting terminal B has a first protrusion 10 which extends into a first recess made within the second contacting terminal C, where the first recess has a first boundary 11 and a second boundary 13 that face each other. In addition to the first protrusion 10 and the first recess, a second protrusion 12 extends into a second recess having a third boundary 15 and sharing the second boundary 13 with the first recess. A wide and straight trace line extends between the outer boundaries, here the first boundary 11 and the third boundary 15, overlapping with them as well as with the inner boundary 13 and the two protrusions 10 and 12. In that a second resistor is formed between the first protrusion 10 and the first boundary 11, and a third resistor between the first protrusion 10 and the second boundary 13. A fourth resistor is formed between the second boundary 13 and the second protrusion 12, and a fifth resistor between the second protrusion 12 and the third boundary 15. The resistance value $R_{10}$ of the low ohmic resistor is made up by the parallel network of the second, third, fourth and fifth resistors, as is indicated by the electrical diagram of FIG. 14. In FIG. 8, the first longitudinal side 1 of the first contacting terminal B includes with the third contacting terminal A an angle of zero degrees, and screening part 16 of the second contacting terminal C is placed in between terminals B and A.

FIG. 9 differs from the example of FIG. 8 only in that the first contacting terminal B is rotated such that its first longitudinal side 1 includes with the third contacting terminal A an angle of ninety degrees. The first boundary 11 and the bottom 14 of the first and second recesses function at the same time as screening part of the second contacting terminal C.

As was recognized by the inventors, a further advantage can be achieved when the drifting characteristics of the high and low ohmic resistors in the voltage divider are matched even further, thereby allowing for a further improved temperature stability and long term stability of the voltage ratio. Using the same resistive film material is already a first important step in that direction. Further, the inventors have taken into account different effects, which may influence the initial value and/or the drifting characteristics of the voltage ratio. In the following, further developments of the disclosure are described, where the high and low ohmic resistors are designed in such a way that these effects occur in all resistors to possibly the same extent.

Figure 10:
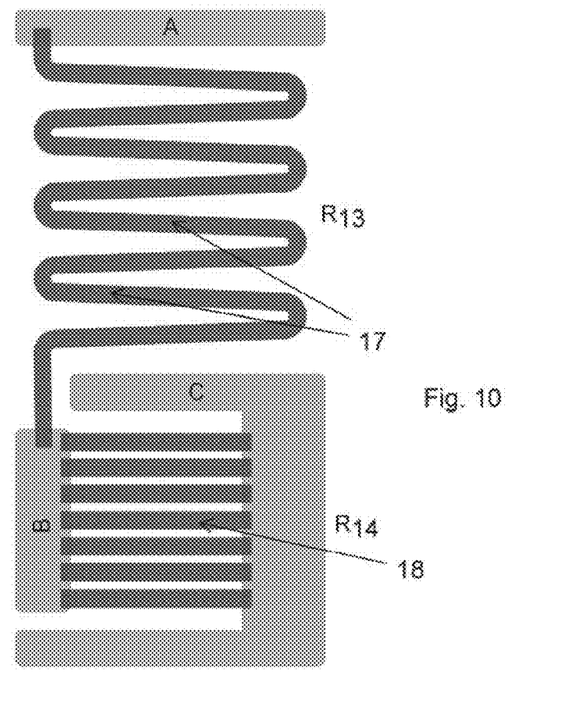
Figure 13:
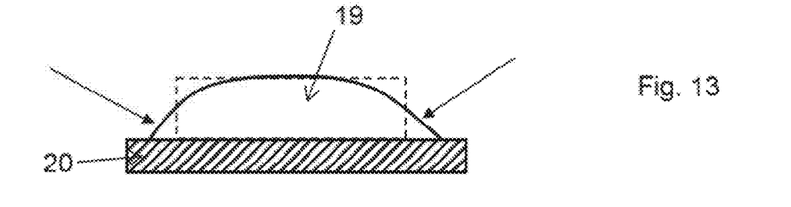
FIG. 13 shows a schematic cross-section view of a resistor trace.

One important effect which has an impact on the resistance values is the so called edge effect occurring at the lateral edges of the trace width. When looking at the cross section of a typical trace, the lateral edges of the trace are usually not straight and cut sharply, but rather gradually decreasing towards the outer ends. In the edge region of the trace, it is likely that the composition and/or the structure of the electrically resistive film material are slightly altered with respect to the region in the middle of the trace. Accordingly, it can be noted that with decreasing trace width the edge effect plays a larger role in affecting the trace resistance per unit length compared to the expected resistance of an ideal trace with rectangular cross section and homogenous composition and structure. FIG. 13 shows a schematic cross-section view of a real resistor trace depicted with a solid line, compared to an ideal resistor trace shown with a dotted line. Reference 19 indicates the resistive film material and reference 20 the insulating substrate. The arrows indicate the areas at the edges of the trace width where the so called edge effects occur. The size of these areas is approximately the same for all trace widths which means that the real resistance value differs more from the ideal resistance value for smaller trace widths. In order to have the same amount of influence of the edge effect on the resistance value of the high and low ohmic resistors, it is therefore advantageous to provide the resistors with the same trace width, thereby ensuring superior matching of their resistance values and accordingly improved initial accuracy, temperature stability and long term stability. However, it may be necessary to make compromises between the trace width and, for example, the available substrate area or the desired resistance values. In these cases, it is suggested to design the high and low ohmic resistors such that they have a similar trace width, meaning that the trace widths may vary within certain limits around a predefined average trace width. A preferred limit is that the narrowest trace width may not be narrower than half of the widest trace width. In case of FIGS. 3 to 9, where the trace width of the low ohmic resistors is much larger than the trace width of the corresponding high ohmic resistors, the resistance value of the low ohmic resistor is more strongly affected by the edge effect compared to the respective high ohmic resistors. In order to match the impact of the edge effect on the resistance values, both the high and low ohmic resistors of FIGS. 10 and 11 are provided with the same trace width.

It is suggested according to a further embodiment to place at least one further resistor trace geometrically in parallel with the trace of the second resistor, with the ends of its trace overlapping with the first protrusion and the first boundary, respectively. This concept can be extended as far as required by design criteria of the voltage divider, i.e. multiple rows of resistor traces may be placed geometrically in parallel, all of them overlapping with the teeth of the comb-shapes of the contacting terminals. An example for this embodiment is shown in FIG. 11, which differs from FIG. 8 in that the resistance value $R_{15}$ of the low ohmic resistor is made up by sixteen instead of just four parallel resistors. In addition, the second contacting terminal C surrounds the first contacting terminal B from three sides and the trace of the high ohmic resistor is no longer formed as a square wave, but as a meandering form with round corners at the bends. In the example of FIG. 11, the parallel resistor traces of the low ohmic have not only the same trace width but also a similar trace length, meaning that the trace lengths may vary within certain limits around a predefined average trace length. A preferred limit is that the shortest trace length may not be shorter than half of the longest trace length.

Further effects which play a role in affecting the resistivity of the resistive film material are related to the fabrication techniques. For example, when the resistors are screen printed using thick film technology and accordingly screen printing is used, the direction of the mechanical movement of the screen over the insulating surface establishes a certain anisotropic behaviour of the resulting trace resistance per unit length, depending on the printing direction. Anisotropic behaviour is also unavoidable when thin film technology is used, since the sputtering angle over the substrate area is not perfectly perpendicular and constant but varies slightly. In addition, mechanical stresses which may occur during the fabrication, in particular during packaging and when electrical connections are made to the contacting terminals, as well as during the lifetime of the voltage divider are often of anisotropic nature. Anisotropic stresses may be more pronounced for three-dimensional, e.g. cylindrical, voltage dividers, than for two-dimensional, flat voltage dividers. In order to affect the high and low ohmic resistors in the same anisotropic way, it is suggested in a further development of the disclosure to arrange dominant trace segments of the resistors with approximately the same orientation and where the dominant trace segments enclose an angle between zero and maximum thirty degrees The term dominant trace segment is used for those parts of a meandering trace which are of considerable length, opposed to just the bends, and which have the highest impact on the overall resistance value of that trace compared to other trace segments. In case of a straight line, the dominant trace segment and the trace itself are the same.

Figure 11:
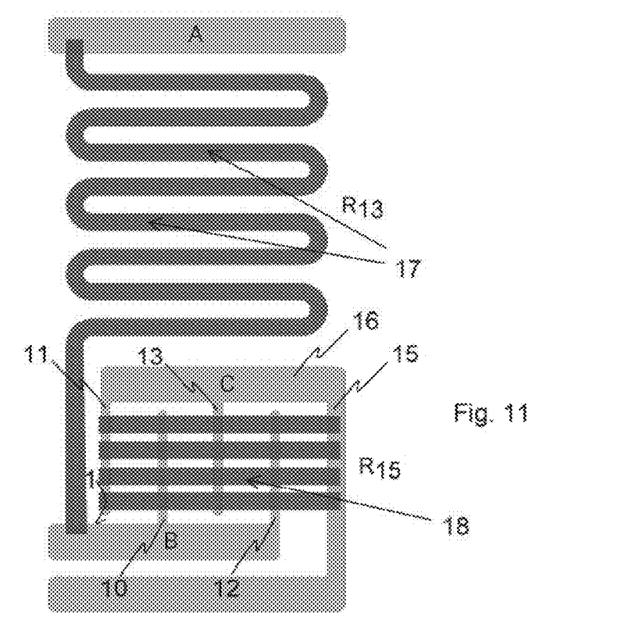

The dominant traces 17 of the high ohmic resistor in FIG. 11 include with the resistor traces 18 of the low ohmic resistor an angle of zero degrees. In the example of FIG. 10, this angle has a value above zero and below thirty degrees. Apart from that, the voltage divider of FIG. 10 differs from the divider of FIG. 5 by its special design for the low ohmic resistor, where the resistance value $R_{14}$ is achieved by the parallel connection of seven resistors without using the comb-shape form of FIGS. 8, 9 and 11.

In all the shown embodiments, the resistive film material of the resistor traces overlaps with the corresponding contacting terminals A, B and C, respectively, by being placed on top of the contacting terminals. In the alternative, the overlap may of course be achieved by putting the contacting terminals on top.

Figure 12:
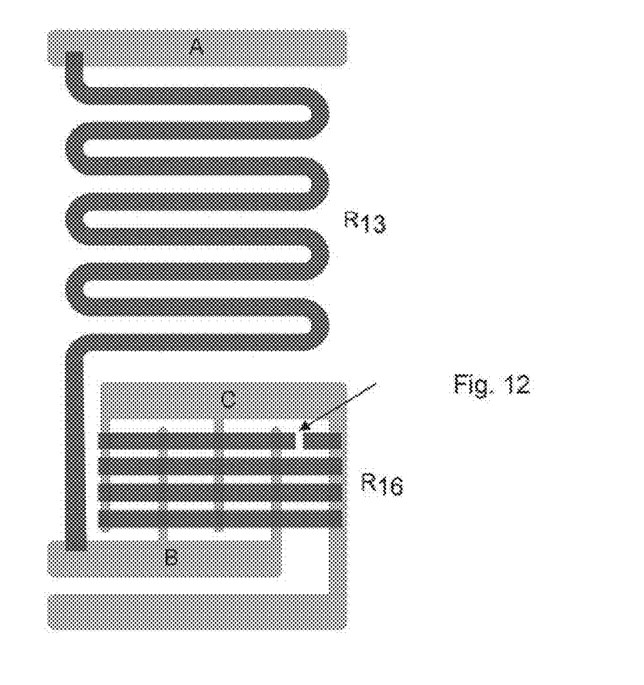
FIG. 12 exemplifies the trimming of a low ohmic resistor.

In FIG. 12, the voltage divider according to the embodiment of FIG. 11 is shown. In FIG. 12, one of the resistor traces belonging to the low ohmic resistor is interrupted by cutting it in two pieces, as indicated by the solid arrow. In that way, one of the resistors of the corresponding parallel resistor network is eliminated, thereby increasing the resistance value $R_{15}$ by one increment. The adjustment of the resistance value of a film resistor by erasing part of the resistive film material is known in the art as trimming. It may be noted that the design of the low ohmic resistor as a network of parallel resistor traces allows the trimming in a kind of digital manner by taking away whole resistors from the resistor network, opposed to analogue trimming which is achieved by erasing the resistive film material of a resistor trace only partly, as for example described in U.S. Pat. No. 7,079,004. Analogue trimming leaves behind cutting edges within the resistor's film material which may alter the microstructure of the material and may induce stresses, both usually affecting the stability of the resistance value. These negative effects can be avoided by applying digital trimming instead.

It will be appreciated by those skilled in the art that he present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description and all changes that come within the meaning and range and equivalence thereof are intended to be embraced therein.

What is claimed is:

1. A resistive voltage divider comprising:
a first resistor and a second resistor electrically connected in series, each of the resistors made of an electrically resistive film material and applied in the form of a trace onto an insulating substrate, wherein:
a voltage ratio of the resistive voltage divider has a value between one hundred and one million;
two ends of a trace of the second resistor overlap at least in part with a first contacting terminal and a second contacting terminal, respectively;
two ends of a trace of the first resistor overlap in part with first and third contacting terminals, respectively;
the second contacting terminal being a screening part itself between the first and the third contacting terminals;
the first contacting terminal has a first longitudinal side and a second longitudinal side, the first and second longitudinal sides being parallel to each other; and
the screening part extends between the first longitudinal side and the second longitudinal side of the first contacting terminal and covers at least the first longitudinal side of the first contacting terminal.

2. The voltage divider of claim 1, wherein the second contacting terminal surrounds the first contacting terminal from at least two sides.

3. The voltage divider of claim 2, wherein the second contacting terminal surrounds the first contacting terminal from at least three sides.

4. The voltage divider claim 1, wherein a part of the first contacting terminal has an elongated shape with the first longitudinal side, the first longitudinal side including with at least a part of the third contacting terminal an angle between one and ninety degrees and the screening part of the second contacting terminal stretching across the whole angle.

5. The voltage divider of claim 4, wherein the second resistor overlaps with the first longitudinal side of the elongated shape and at least in part with the screening part of the second contacting terminal.

6. The voltage divider of claim 5, wherein a third resistor overlaps in part with the first and the second contacting terminals.

7. The voltage divider of claim 6, wherein the elongated shape of the first contacting terminal has the second longitudinal side opposing the first longitudinal side and where the third resistor overlaps with the second longitudinal side.

8. The voltage divider of claim 7, wherein the elongated shape is placed in such a way that both the first and the second longitudinal sides each include with a respective part of the third contacting terminal an angle between one and ninety degrees and where the screening part of the second contacting terminal stretches across both angles.

9. The voltage divider of claim 8, wherein the trace of the second resistor overlaps on one end at least in part with a first protrusion of the first contacting terminal and on the other end at least in part with a first boundary of a first recess provided in the second contacting terminal, and
wherein the trace of the third resistor overlaps on one end at least in part with the first protrusion and on the other end in part with a second boundary of the first recess, where the first and the second boundaries face each other.

10. The voltage divider according to claim 9, wherein the trace of a fourth resistor overlaps on one end at least in part with the second boundary of the first recess and on the other end at least in part with a second protrusion of the first contacting terminal.

11. The voltage divider according to claim 10, where the trace of a fifth resistor overlaps on one end in part with the second protrusion and on the other end at least in part with a third boundary of a second recess provided in the second contacting terminal,
wherein the second and third boundaries face each other and are both part of the second recess.

12. The voltage divider according to claim 9, wherein the trace of at least one further resistor is placed geometrically in parallel with the trace of the second resistor and where the ends of its trace overlap at least in part with the first protrusion and the first boundary, respectively.

13. The voltage divider of claim 1, wherein the resistors are made of the same resistive film material.

14. The voltage divider of claim 1, wherein the second and further resistors have a similar trace length.

15. The voltage divider of claim 1, wherein the resistors have a similar trace width.

16. The voltage divider of claim 1, wherein the first resistor is arranged in the shape of a meandering form.

17. The voltage divider of claim 1, wherein the first resistor is arranged in a helical shape.

18. The voltage divider according to claim 1, wherein dominant trace segments of the resistors are arranged with approximately the same orientation and where the dominant trace segments enclose an angle between zero and maximum thirty degrees.

19. The voltage divider of claim 18, wherein the trace of at least one of the second and any further resistor is cut in two pieces for trimming purposes.

20. The voltage divider of claim 19, wherein at least one of the first and further protrusion is cut in two pieces for trimming purposes.

21. The voltage divider of claim 20, wherein at least one of the first and further boundaries is cut in two pieces for trimming purposes.

22. A voltage sensor comprising a voltage divider according to claim 1.

23. The resistive voltage divider according to claim 1, wherein the screening part of the second contacting terminal covers the first and second longitudinal sides of the first contacting terminal.

24. The resistive voltage divider according to claim 1, wherein the first contacting terminal comprises a plurality of first protrusions extending perpendicular to the first and second longitudinal sides of the first contacting terminal,
   wherein the second contacting terminal comprises a plurality of second protrusions extending perpendicular to the first and second longitudinal sides of the first contacting terminal, and
   wherein the first and second protrusions are parallel to each other and are arranged between the first longitudinal side of the first contacting terminal and the screening part of the second contacting terminal.

* * * * *